United States Patent
Kitagawa et al.

(10) Patent No.: US 10,791,660 B2
(45) Date of Patent: Sep. 29, 2020

(54) CONNECTION STRUCTURE OF A SHIELDED TERMINAL SUPPORTING EXTERNAL CONDUCTOR OF ELECTRIC CABLE

(71) Applicant: YAZAKI CORPORATION, Tokyo (JP)

(72) Inventors: Hiroki Kitagawa, Shizuoka (JP); Yuya Yamada, Shizuoka (JP); Kenta Yasuda, Shizuoka (JP); Ryuta Fujii, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 10 days.

(21) Appl. No.: 15/998,970

(22) PCT Filed: Mar. 15, 2017

(86) PCT No.: PCT/JP2017/010503
§ 371 (c)(1),
(2) Date: Aug. 17, 2018

(87) PCT Pub. No.: WO2017/159751
PCT Pub. Date: Sep. 21, 2017

(65) Prior Publication Data
US 2019/0307030 A1 Oct. 3, 2019

(30) Foreign Application Priority Data
Mar. 18, 2016 (JP) .................. 2016-056170

(51) Int. Cl.
*H05K 9/00* (2006.01)
*H01B 7/18* (2006.01)
(Continued)

(52) U.S. Cl.
CPC ............. *H05K 9/0098* (2013.01); *H01B 7/18* (2013.01); *H01R 4/183* (2013.01); *H01R 4/20* (2013.01);
(Continued)

(58) Field of Classification Search
CPC .......... H05K 9/0098; H05K 9/00; H01B 7/18; H01R 4/183; H01R 1/20; H01R 9/0518; H01R 4/0524
(Continued)

(56) References Cited

U.S. PATENT DOCUMENTS 6,837,728 B2 * 1/2005 Miyazaki ............... H01R 9/032
439/271
7,491,071 B2 * 2/2009 Hamai ................. H01R 9/0527
439/882
(Continued)

FOREIGN PATENT DOCUMENTS

JP 3004487 U 11/1994
JP 2002-218621 A 8/2002
(Continued)

OTHER PUBLICATIONS

English translation of the International Search Report for PCT/JP2017/010503 dated Jun. 13, 2017.
(Continued)

*Primary Examiner* — Peter G Leigh
(74) *Attorney, Agent, or Firm* — Kenealy Vaidya LLP

(57) ABSTRACT

A connection structure of a shield terminal (30) is electrically connected and fixed to an opening end part of a tubular braided wire (20) covering a covered wire (10) along the long direction. The shield terminal (30) has: a tubular caulked part (33) for which the part folded back outwardly at the opening end part of the braided wire (20) is fixed by caulking to the outer peripheral surface by a caulking sleeve
(Continued)

(40); and a pressure energizing part (35) provided near the caulked part (33) and pressed and energized so that the braided wire (20) does not move in relation to the covered wire (10).

6 Claims, 8 Drawing Sheets

(51) Int. Cl.
*H01R 4/18* (2006.01)
*H01R 4/20* (2006.01)
*H01R 9/05* (2006.01)

(52) U.S. Cl.
CPC ......... *H01R 9/0518* (2013.01); *H01R 9/0524* (2013.01); *H05K 9/00* (2013.01)

(58) Field of Classification Search
USPC .......................................................... 439/98
See application file for complete search history.

(56) References Cited

U.S. PATENT DOCUMENTS

| | | | | |
|---|---|---|---|---|
| 8,191,250 B2 * | 6/2012 | Kawase | ............... | H01R 9/0509 174/750 |
| 8,460,015 B2 * | 6/2013 | Deno | ................... | H01R 9/0518 174/78 |
| 8,602,797 B2 * | 12/2013 | Omae | ................ | H01R 13/6592 439/99 |
| 9,039,450 B2 * | 5/2015 | Germ | ..................... | H01R 9/032 439/607.41 |
| 9,196,976 B2 * | 11/2015 | De France | ........... | H01R 9/0512 |
| 9,272,675 B2 * | 3/2016 | Toyama | .............. | B60R 16/0215 |
| 2002/0106918 A1 | 8/2002 | Saito et al. | | |
| 2004/0099427 A1 * | 5/2004 | Kihira | .................... | H01R 9/032 174/359 |
| 2010/0022126 A1 * | 1/2010 | Miyashita | ................ | H01R 4/18 439/585 |
| 2015/0064992 A1 * | 3/2015 | Kato | .................... | H01R 9/0524 439/879 |
| 2015/0107896 A1 * | 4/2015 | Kato | .................... | H01R 9/0518 174/74 R |

FOREIGN PATENT DOCUMENTS

| | | | | | |
|---|---|---|---|---|---|
| JP | 2002218621 A | * | 8/2002 | ........... | H01R 9/0518 |
| JP | 2006-269666 A | | 10/2006 | | |
| JP | 2010-160957 A | | 7/2010 | | |
| JP | 2013-236429 A | | 11/2013 | | |

OTHER PUBLICATIONS

International Search Report and Written Opinion of the International Search Report for PCT/JP2017/010503 dated Jun. 13, 2017.
The extended European search report for the related European Patent Application No. 17766747.4 dated Feb. 28, 2019.

* cited by examiner (a)

(b)

(c)

(a)

(b)

(c)

CONNECTION STRUCTURE OF A SHIELDED TERMINAL SUPPORTING EXTERNAL CONDUCTOR OF ELECTRIC CABLE

TECHNICAL FIELD

The present invention relates to a connection structure of a shield terminal.

BACKGROUND ART

There is proposed a shield structure in order to prevent an influence of electrical noises or to prevent radiation of the electrical noises. In the shield structure, a non-shielded wire is inserted into a braided wire which is made by braiding conductive strands in a tubular shape. A range necessary to be shielded in the non-shielded wire (sheathed wire) is covered with the braided wire (see Patent Literature 1).

In such a shield structure, the braided wire mounted in the non-shielded wire is inserted from an opening of a terminal metal fitting body. An end portion of the braided wire protruding from the other opening is folded back to the outer side of the terminal metal fitting body. A braided-wire pressing ring is plugged in to caulk, so that the terminal metal is fixed to the end portion of the braided wire.

CITATION LIST

Patent Literature

Patent Literature 1: JP-A-2006-269666

SUMMARY OF THE INVENTION

Technical Problem

However, since the braided wire inserted into the non-shielded wire has no base point when the end portion is folded back to the outer side of the terminal metal fitting body, there is a problem in that the end portion is hard to be folded back at a specified position and a predetermined braided length.

The invention has been made in view of the circumstance, and an object thereof is to provide a connection structure of a shield terminal in which a braided wire is easily folded back and caulked at a specified position and which is excellent in workability.

Solution to Problem

In order to achieve the above-described object, a connection structure of a shield terminal according to the invention has the following features (1) to (3).

(1) A connection structure of a shield terminal which is electrically connected and fixed to an opening end portion of a tubular braided wire covering a sheathed wire along a longitudinal direction thereof, wherein the shield terminal includes:

a tubular caulked portion in which a portion folded back to the outer side in the opening end portion of the braided wire is caulked and fixed to an outer peripheral surface of the caulked portion by a caulking sleeve; and a pressing urging portion which is provided near the caulked portion, and presses and urges the braided wire not to move the braided wire with respect to the sheathed wire.

In the connection of the shield terminal according to the configuration of (1), the braided wire is pressed and urged not to move the braided wire with respect to the sheathed wire by the pressing urging portion before the opening end portion of the braided wire covering the sheathed wire is caulked and fixed to the caulked portion of the shield terminal. Therefore, it is possible to restrict the movement of the braided wire and the shield terminal with respect to the sheathed wire.

Then, the opening end portion of the braided wire is capable of being folded back about the opening end serving as a base point of the caulked portion which is restricted in movement at the specified position with respect to the sheathed wire, so that a folding work is easily performed.

Even when the folded portion of the braided wire is caulked and fixed to the outer peripheral surface of the caulked portion by the caulking sleeve, the braided wire and the shield terminal themselves are restricted in movement with respect to the sheathed wire, so that the caulking work is easily performed.

(2) The connection structure of the shield terminal according to (1), wherein the pressing urging portion is provided in a cylindrical portion, which is integrally and coaxially formed with the caulked portion and includes a terminal fixing portion protruding from an outer peripheral surface of the cylindrical portion, and wherein a pressing urging portion is configured to be plastically deformed such that a portion, which is interposed between a pair of parallel notch grooves notched by a predetermined length in a circumferential direction of the cylindrical portion, protrudes to an inner side of the cylindrical portion.

In the connection structure of the shield terminal of the configuration of (2), the pressing urging portion is formed of a portion which is obtained by plastically deforming a predetermined range in the circumferential direction of the cylindrical portion. Then, the braided wire can be pressed and urged without exerting an influence on the terminal fixing portion protrudingly provided in the cylindrical portion: It is possible to minimize a reduction in bending strength of the cylindrical portion.

The portion interposed between the pair of parallel notch grooves which are notched in the circumferential direction of the cylindrical portion does not cause a plastic deformation thereof to be transferred in an axial direction of the cylindrical portion. However, the portion can press and urge the braided wire without exerting an influence on a portion other than the pressing urging portion of the cylindrical portion.

Further, the portion interposed between the pair of parallel notch grooves which are notched in the circumferential direction of the cylindrical portion can press and urge the braided wire through a surface. Then, there is no damage on the braided wire and the sheathed wire.

The portion interposed between the pair of parallel notch grooves which are notched in the circumferential direction of the cylindrical portion is formed in a both-end supported beam shape. Therefore, it is possible to apply a large urging force by a small plastic deformation.

(3) The connection structure of the shield terminal according to (2), wherein a wire guiding portion is provided in an opening end on the opposite side to the caulked portion in the cylindrical portion and a tip end of the wire guiding portion is widened outwardly in a radial direction.

In the connection structure of the shield terminal according to the configuration of (3), in order to fix the shield terminal, the end of the braided wire to be inserted from the opening end of the cylindrical portion together with the sheathed wire is inserted while being guided by the wire guiding portion which includes a guide tapered surface. Then, the insertion work when the sheathed wire covered by the braided wire is inserted into the cylindrical portion of the shield terminal becomes smooth, and the workability is improved.

There is no concern that the braided wire covering the sheathed wire is damaged or disconnected by the opening end (edge) of the cylindrical portion at the time of inserting.

Advantageous Effects of the Invention

According to the invention, it is possible to provide the connection structure of the shield terminal in which the braided wire is easily folded back and caulked at a specified position and which is excellent in workability.

Hitherto, the invention has been described shortly.

Further, the details of the invention will become apparent by reading through the description of modes (hereinafter, referred to as "embodiments") for carrying out the invention with reference to the accompanying drawings.

BRIEF DESCRIPTION OF THE DRAWINGS

FIG. 5 is perspective views for describing a connection work to connect the shield terminal to the braided wire of a sheathed wire, wherein FIGS. 5(a) and 5(b) are a perspective view and a cross-sectional view illustrating main parts and FIG. 5(c) is a perspective view.

DESCRIPTION OF EMBODIMENTS

Hereinafter, embodiments of the invention will be described with reference to the drawings.

Figure 1:
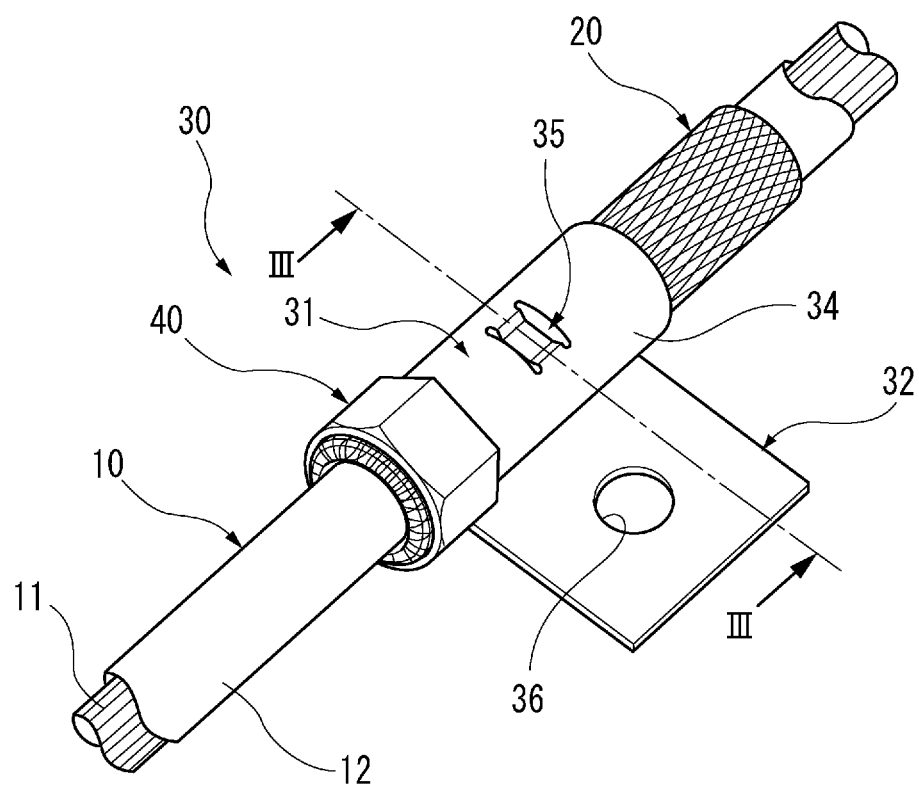
FIG. 1 is a perspective view of a shield terminal which is connected to a braided wire for describing a connection structure of the shield terminal according to an embodiment of the invention.
Figure 2:
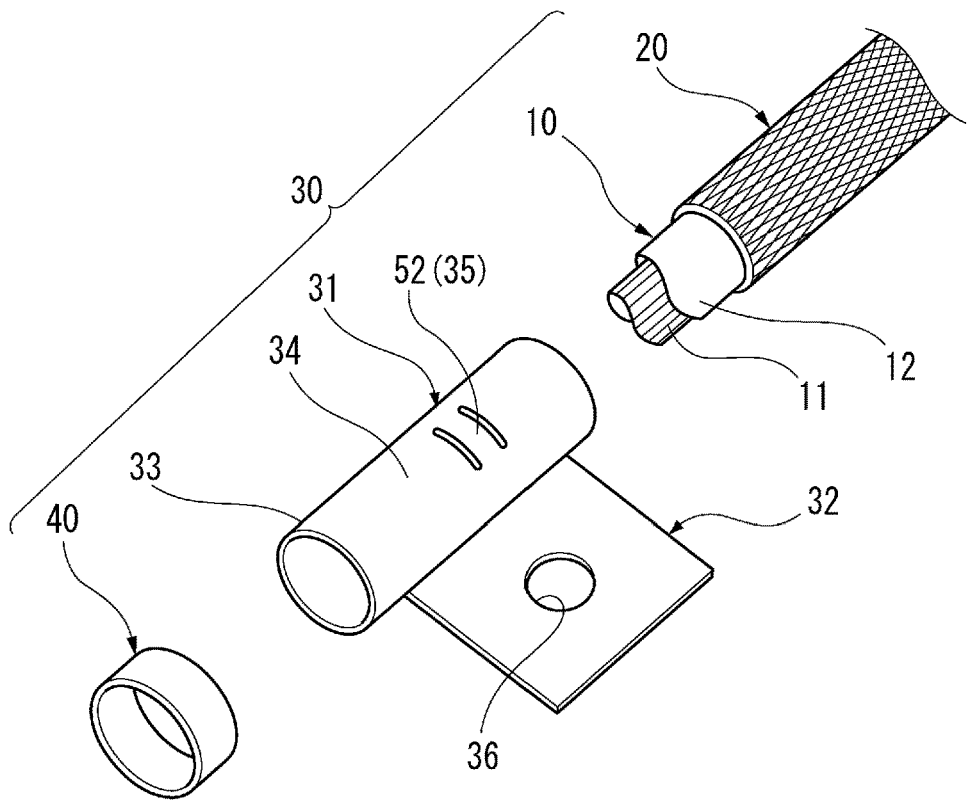
FIG. 2 is an exploded perspective view of the shield terminal illustrated in FIG. 1.
Figure 3:
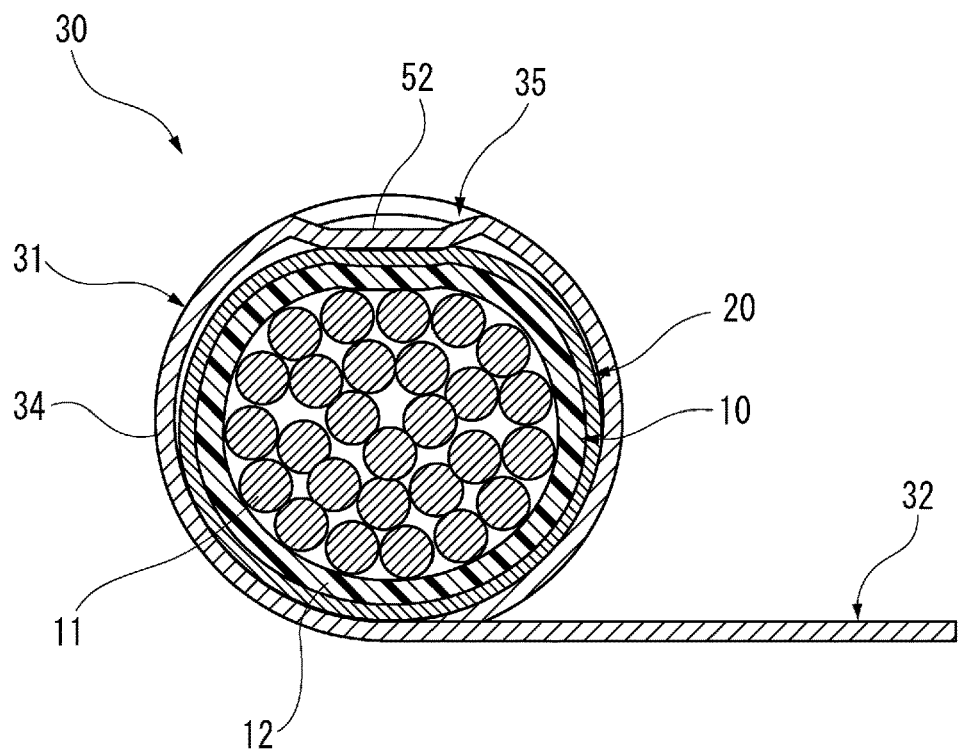
FIG. 3 is a cross-sectional view taken along line in FIG. 1.
Figure 4:
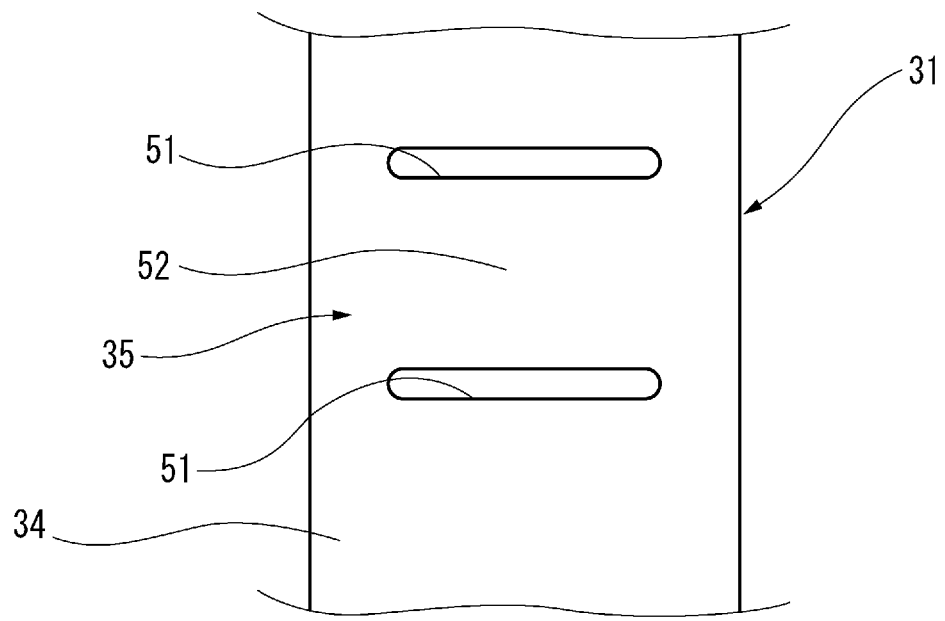
FIG. 4 is a top view before a pressing urging portion of the shield terminal is deformed.

FIG. 1 is a perspective view of a shield terminal 30 connected to a braided wire 20 for describing a connection structure of a shield terminal according to an embodiment of the invention. FIG. 2 is an exploded perspective view of the shield terminal 30 illustrated in FIG. 1. FIG. 3 is a cross-sectional view taken along line in FIG. 1. FIG. 4 is a top view before a pressing urging portion of the shield terminal is deformed.

As illustrated in FIGS. 1 and 2, the connection structure of the shield terminal according to this embodiment is a connection structure in which the braided wire 20 mounted in a sheathed wire 10 is connected to the shield terminal 30. In the connection structure of the shield terminal, the shield terminal 30 is connected to the braided wire 20 which is mounted to a partial range necessary for electromagnetic shield measures in the sheathed wire 10.

As illustrated in FIG. 2, the sheathed wire 10 is, for example, a non-shielded wire (high-voltage wire) in which a conductor 11 is coated with an insulator 12. The conductor is configured by strands made of a conductive metal material (copper as a main material). The insulator 12 extrudes and coats the conductor 11.

The braided wire 20 is formed in a tubular shape. The sheathed wire 10 is inserted into the braided wire 20. With this configuration, the surrounding portion necessary for the electromagnetic shield measures in the sheathed wire 10 is coated along a longitudinal direction by the braided wire 20. The braided wire 20 is made by braiding the conductive strands in a tubular shape. The strands of the braided wire 20 are made of a conductive metal material, and have a high shield property. As a strand, besides the conductive metal material, there is a mesh strand which is made by plating a resin wire such as polyester with Cu (copper) and by being wound in a spiral shape.

The shield terminal 30 is electrically connected and fixed to an opening end portion of the braided wire 20 which covers the outer periphery of the sheathed wire 10, and includes a terminal body 31 and a terminal fixing portion 32. The terminal body 31 includes a caulked portion 33 and a pressing urging portion 35 which is provided in a cylindrical portion 34. The caulked portion 33 is formed in a tubular shape (a cylindrical shape in this embodiment). The cylindrical portion 34 is integrally and coaxially formed with the caulked portion 33, and is formed in a tubular shape having the same inner and outer diameters as those of the caulked portion 33. In the terminal body 31 having the caulked portion 33 and the cylindrical portion 34, the sheathed wire 10 mounted with the braided wire 20 is inserted.

As illustrated in FIG. 1, the braided wire 20 is fixed to an outer peripheral surface of the caulked portion 33. The opening end portion of the braided wire 20 is folded back to the outer side to cover the caulked portion 33. The portion folded to the outer side in the opening end portion of the braided wire 20 is caulked and fixed to the outer peripheral surface by a caulking sleeve 40. The caulking sleeve 40 is formed of, for example, a metal material, and is formed in a ring shape with a predetermined thickness. The caulking sleeve 40 has an inner diameter slightly larger than the outer diameter of the caulked portion 33 on which the opening end portion of the braided wire 20 is folded back and covered. Fitted to the caulked portion 33 covered with the folded portion of the braided wire 20, the caulking sleeve 40 is, for example, plastically deformed in a hexagonal shape in cross-sectional view and caulked to the caulked portion 33. With this configuration, the braided wire 20 folded back to the caulked portion 33 is caulked and fixed to the caulked portion 33. The braided wire 20 is electrically connected to the terminal body 31 of the shield terminal 30.

In the cylindrical portion 34 integrally and coaxially formed with the caulked portion 33, the terminal fixing portion 32 protrudes to the outer peripheral surface. The terminal fixing portion 32 is formed in a plate shape having a through hole 36. For example, the terminal fixing portion is fastened to the body of a vehicle by screwing a screw (not illustrated) passing through the through hole 36 in the body of the vehicle. The shield terminal 30 is electrically connected to the body of the vehicle by fastening the terminal fixing portion 32 to the body of the vehicle.

As illustrated in FIG. 1, the pressing urging portion 35 is provided at a position close to the caulked portion 33 in the cylindrical portion 34. As illustrated in FIG. 4, the pressing urging portion 35 includes a pair of parallel notch grooves 51 which are notched by a predetermined length in a circumferential direction of the cylindrical portion 34, and a pressing portion 52 which is formed by a portion interposed between these notch grooves 51. As for the length of the notch groove 51, about a quarter (¼) of the circumferential direction of the cylindrical portion 34 is preferable.

As illustrated in FIG. 3, the pressing urging portion 35 is plastically deformed such that the pressing portion 52 protrudes to the inner side of the cylindrical portion 34. With this configuration; the pressing urging portion 35 presses and urges the braided wire 20 such that the braided wire 20 does not move with respect to the sheathed wire 10.

Next, the description will be given about a connection work in which the braided wire 20 is mounted to the sheathed wire 10, and the shield terminal 30 is connected to the braided wire 20.

Figure 5:
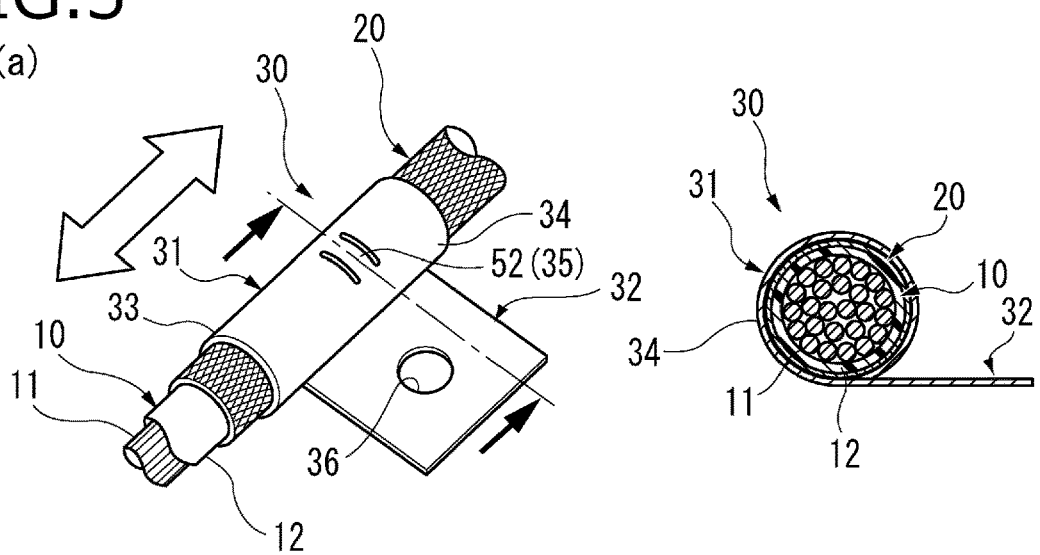
Figure 5:
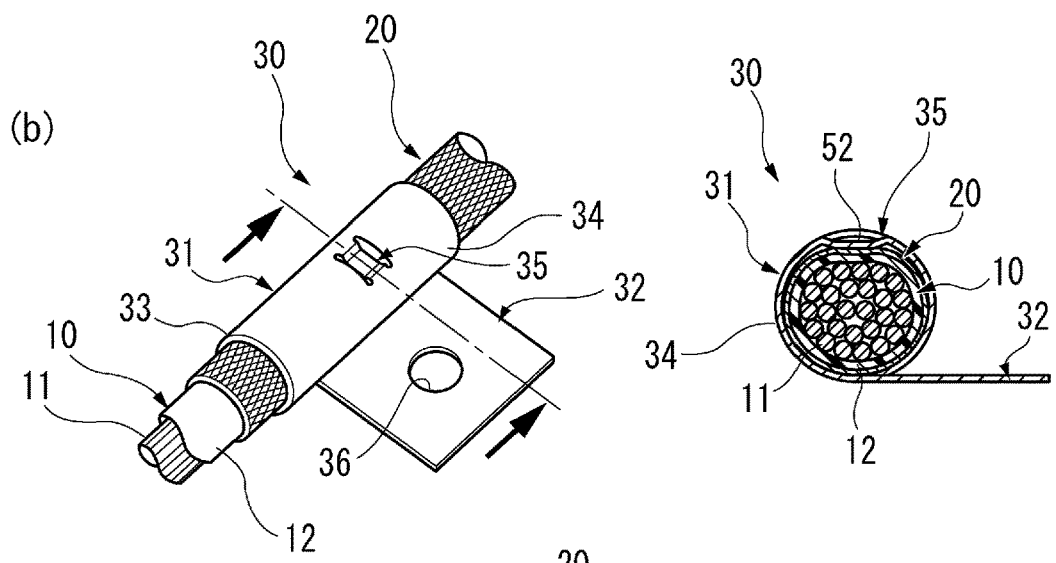
Figure 5:
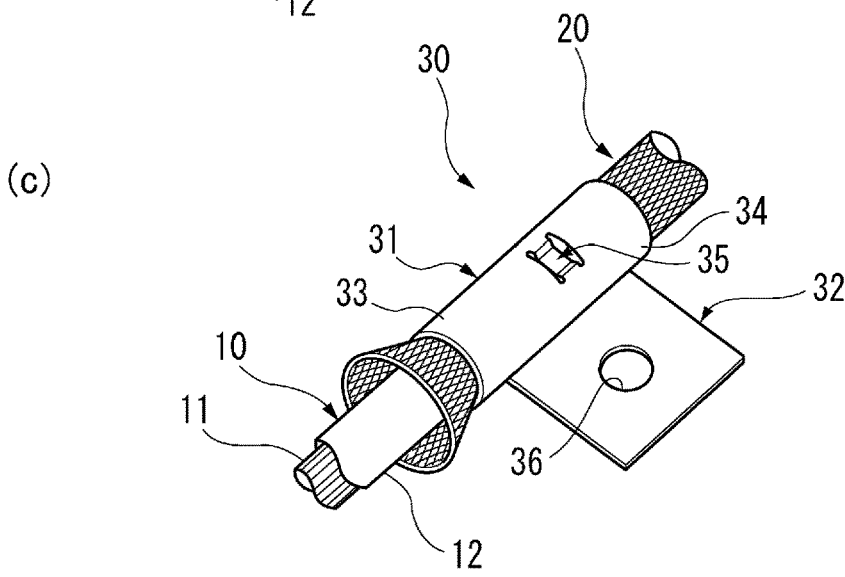
Figure 6:
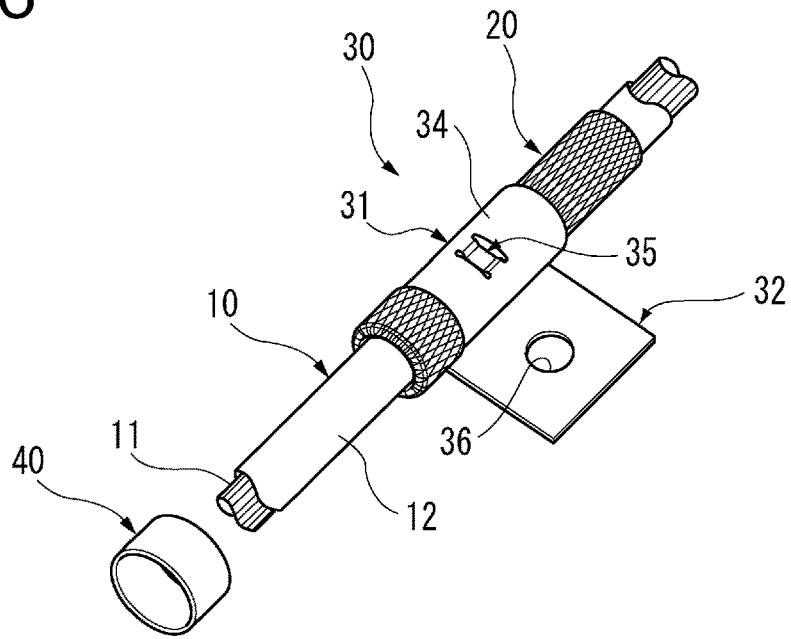
FIGS. 6(a) to 6(c) are perspective views for describing the connection work to connect the shield terminal to the braided wire of the sheathed wire.
Figure 6:
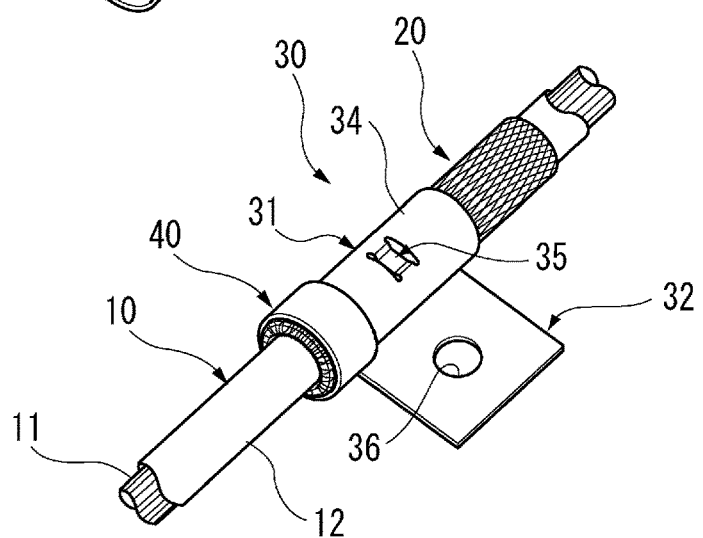
Figure 6:
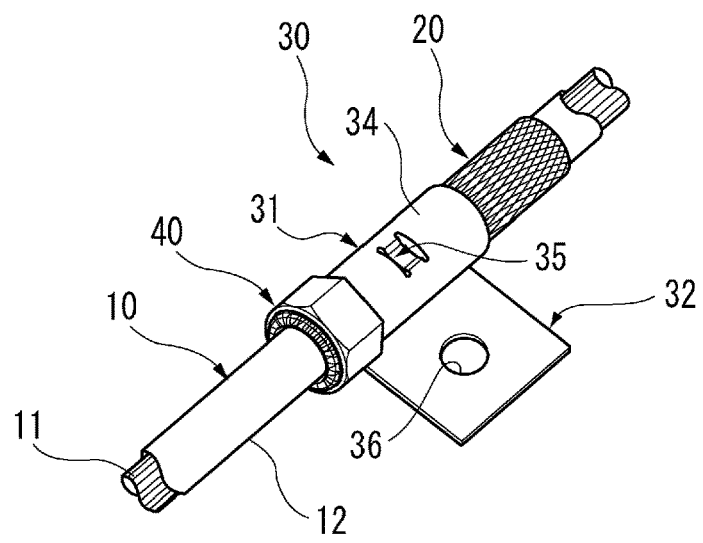

FIGS. 5(a) to 6(c) are diagrams for describing the connection work to connect the shield terminal 30 to the braided wire 20 of the sheathed wire 10. FIGS. 5(a) and 5(b) are a perspective view and a cross-sectional view. FIG. 5(c) is a perspective view.

As illustrated in FIG. 5(a), the sheathed wire 10 of which the outer periphery is mounted with the braided wire 20 is inserted into the terminal body 31 which includes the caulked portion 33 and the cylindrical portion 34 of the shield terminal 30. The shield terminal 30 is disposed at a predetermined position to be fixed to the sheathed wire 10. At this time, the shield terminal 30 is disposed to protrude as long as the opening end portion of the braided wire 20 is folded back from the end of the caulked portion 33 of the terminal body 31.

As illustrated in FIG. 5(b), the pressing portion 52 serving as the pressing urging portion 35 formed in the cylindrical portion 34 of the shield terminal 30 presses to the inner side of the cylindrical portion 34, and plastically deformed to protrude to the inner side of the cylindrical portion 34. Then, the braided wire 20 is pressed to the outer peripheral surface of the sheathed wire 10 by the pressing portion 52 of the pressing urging portion 35 pressed to the inner side of the cylindrical portion 34, and pressed and urged not to move with respect to the sheathed wire 10.

As illustrated in FIG. 5(c), the braided wire 20 protruding from the end on a side near the caulked portion 33 of the terminal body 31 is folded back to the outer side to cover the caulked portion 33. At this time, the braided wire 20 is pressed and urged by the pressing portion 52 of the pressing urging portion 35 so as not to move with respect to the sheathed wire 10. Therefore, the braided wire 20 and the shield terminal 30 themselves are restricted in movement with respect to the sheathed wire 10. Therefore, the opening end portion of the braided wire 20 can be easily folded back to the outer side about the opening end of the caulked portion 33 of which movement is restricted at a specified position with respect to the sheathed wire 10.

Next, as illustrated in FIG. 6(a), the caulking sleeve 40 is brought close from the end of the sheathed wire 10 to insert the sheathed wire 10 to the caulking sleeve 40.

As illustrated in FIG. 6(b), the caulking sleeve 40 is fitted to the caulked portion 33 of which the outer periphery is covered by folding back the braided wire 20.

As illustrated in FIG. 6(c), for example, the caulking sleeve 40 is caulked in a hexagonal shape in cross-sectional view. With this configuration, the braided wire 20 folded back to the caulked portion 33 is caulked and fixed to the caulked portion 33. The braided wire 20 is electrically connected to the terminal body 31 of the shield terminal 30.

In this way, the caulking sleeve 40 is caulked to the caulked portion 33. Therefore, even during a caulking work to caulk and fix the braided wire 20 to the caulked portion 33, the braided wire 20 is pressed and urged not to move with respect to the sheathed wire 10 by the pressing portion 52 of the pressing urging portion 35, so that the braided wire 20 and the shield terminal 30 are restricted in movement with respect to the sheathed wire 10. Therefore, it is possible to easily perform the caulking work.

Through the above connection work, the terminal fixing portion 32 of the shield terminal 30 connected to the braided wire 20 mounted in the sheathed wire 10 is fastened to the body of the vehicle by the screw. Therefore, the electromagnetic shield measures are taken in the range covered by the braided wire 20 in the sheathed wire 10.

As described above, in the connection structure of the shield terminal 30 according to this embodiment, the braided wire 20 is pressed and urged not to move with respect to the sheathed wire 10 by the pressing urging portion 35 before the opening end portion of the braided wire 20 covering the sheathed wire 10 is caulked and fixed to the caulked portion 33 of the shield terminal 30. Therefore, it is possible to restrict the movement of the braided wire 20 and the shield terminal 30 with respect to the sheathed wire 10.

Then, the opening end portion of the braided wire 20 can be folded back about the opening end of the caulked portion 33 which is restricted in movement at the specified position with respect to the sheathed wire 10, so that a folding work is easily performed.

Even when the folded portion of the braided wire 20 is caulked and fixed to the outer peripheral surface of the caulked portion 33 by the caulking sleeve 40, the braided wire 20 and the shield terminal 30 themselves are restricted in movement with respect to the sheathed wire 10, so that the caulking work is easily performed.

According to the connection structure of the shield terminal 30 of this embodiment, the pressing urging portion 35 is configured by a portion (the pressing portion 52) which is obtained by plastically deforming a predetermined range in the circumferential direction of the cylindrical portion 34. Then, the braided wire 20 can be pressed and urged without exerting an influence on the terminal fixing portion 32 protruding to the cylindrical portion 34. It is possible to minimize a reduction in bending strength of the cylindrical portion 34.

The pressing portion 52 interposed between the pair of parallel notch grooves 51 which are notched in the circumferential direction of the cylindrical portion 34 does not cause a plastic deformation thereof to be transferred in an axial direction of the cylindrical portion 34. The pressing portion can press and urge the braided wire 20 without exerting an influence on a portion other than the pressing urging portion 35 of the cylindrical portion 34.

Further, the pressing portion 52 interposed between the pair of parallel notch grooves 51 which are notched in the circumferential direction of the cylindrical portion 34 can press and urge the braided wire 20 through a surface. Then, there is no damage on the braided wire 20 and the sheathed wire 10.

The pressing portion 52 interposed between the pair of parallel notch grooves 51 which are notched in the circumferential direction of the cylindrical portion 34 is formed in a both-end supported beam shape. Therefore, it is possible to apply a large urging force by a small plastic deformation.

In the above embodiment, the description has been given about that the pair of parallel notch grooves 51 is formed by a predetermined length in the circumferential direction of the cylindrical portion 34 to provide the pressing urging portion 35, but the structure of the pressing urging portion 35 is not limited thereto.

Figure 7:
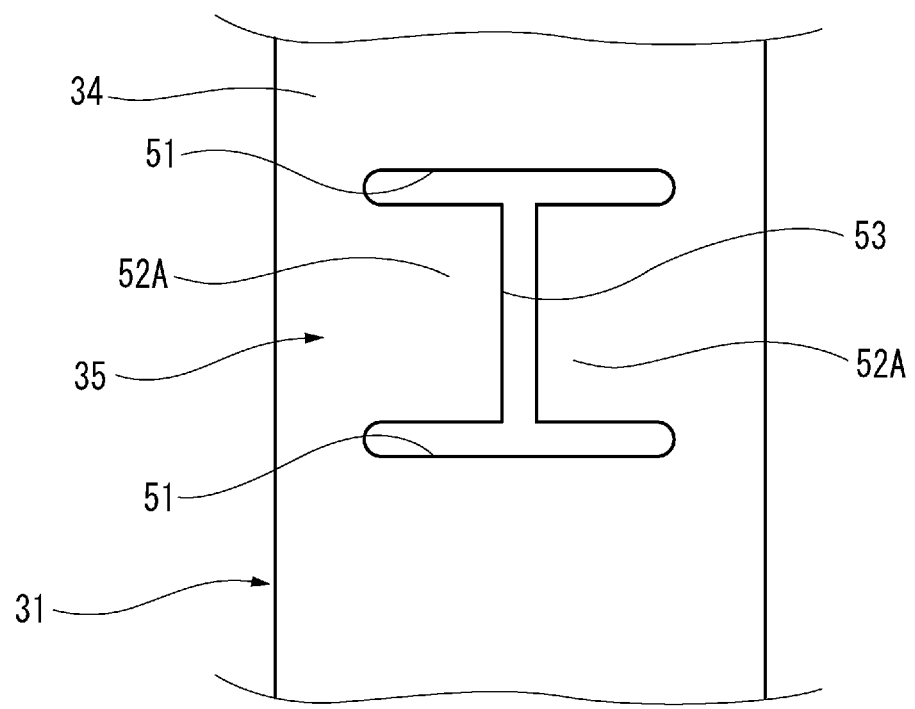
FIG. 7 is a top view before a pressing urging portion of a modification of the pressing urging portion is deformed.

For example, as illustrated in FIG. 7, the pressing urging portion 35 may be formed such that the pair of parallel notch grooves 51 of a predetermined length is formed in the circumferential direction of the cylindrical portion 34 and a longitudinal groove 53 linking the center Portions of these notch grooves 51 is formed so as to divide the pressing portion into two pressing portions 52A. According to the pressing urging portion 35, it is possible to make the pressing portions 52A plastically deformed to the inner side of the cylindrical portion 34.

Figure 8:
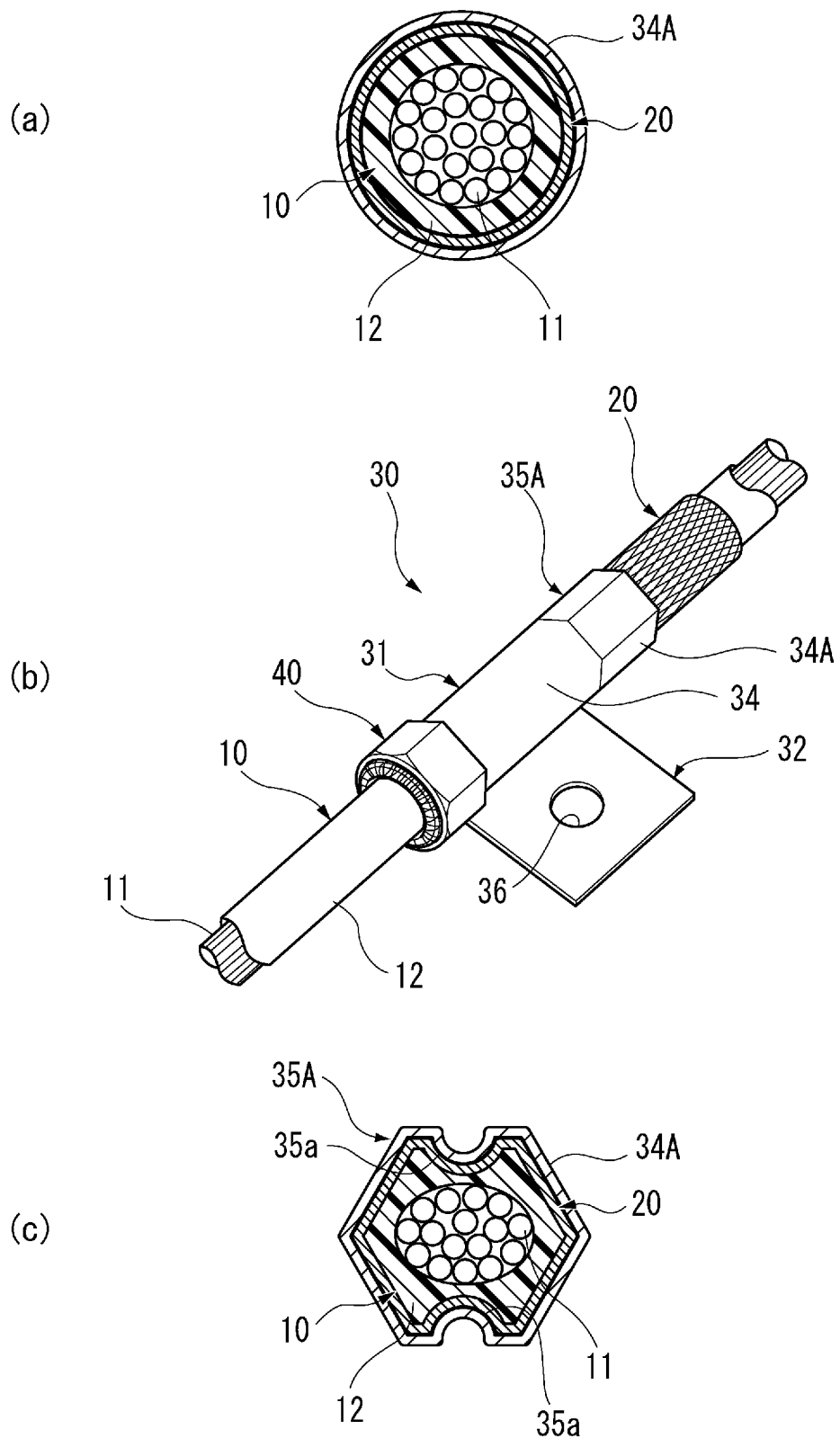
FIG. 8(a) is a cross-sectional view of a cylindrical portion through which the sheathed wire mounted with the braided wire passes.
FIG. 8(b) is a perspective view illustrating the shield terminal which serves as the pressing urging portion by plastically deforming the cylindrical portion.
FIG. 8(c) is a cross-sectional view of the cylindrical portion where a hexagonal pressing urging portion having an indent is formed.

As the pressing urging portion, for example, an extension 34A of the cylindrical portion 34 which is formed in a cylindrical shape as illustrated in FIGS. 8(a) to 8(c) may be a pressing urging portion 35A which is plastically deformed in a hexagonal shape in cross-sectional view. With this configuration, the extension 34A of the deformed cylindrical portion 34 is functioned as the pressing urging portion 35A to press the braided wire 20 to the sheathed wire 10, so that it is possible to restrict the deformation. At this time, as illustrated in FIG. 8(c), the braided wire 20 can be securely held by forming an indent (projection) 35a which protrudes to the inner side of the extension 34A.

The above embodiment has been described above as an example in a case where the pressing urging portion 35A is provided in the cylindrical extension 34A which is integrally and coaxially formed with the caulked portion 33. For example, in a case where there is no cylindrical extension 34A, the pressing urging portion may be provided in a protruding piece which is extended in an axial direction from the caulked portion 33.

Next, a connection structure of the shield terminal according to another embodiment will be described.

The same configurations as those of the above embodiment will be attached with the same symbol, and the description will be omitted.

Figure 9:
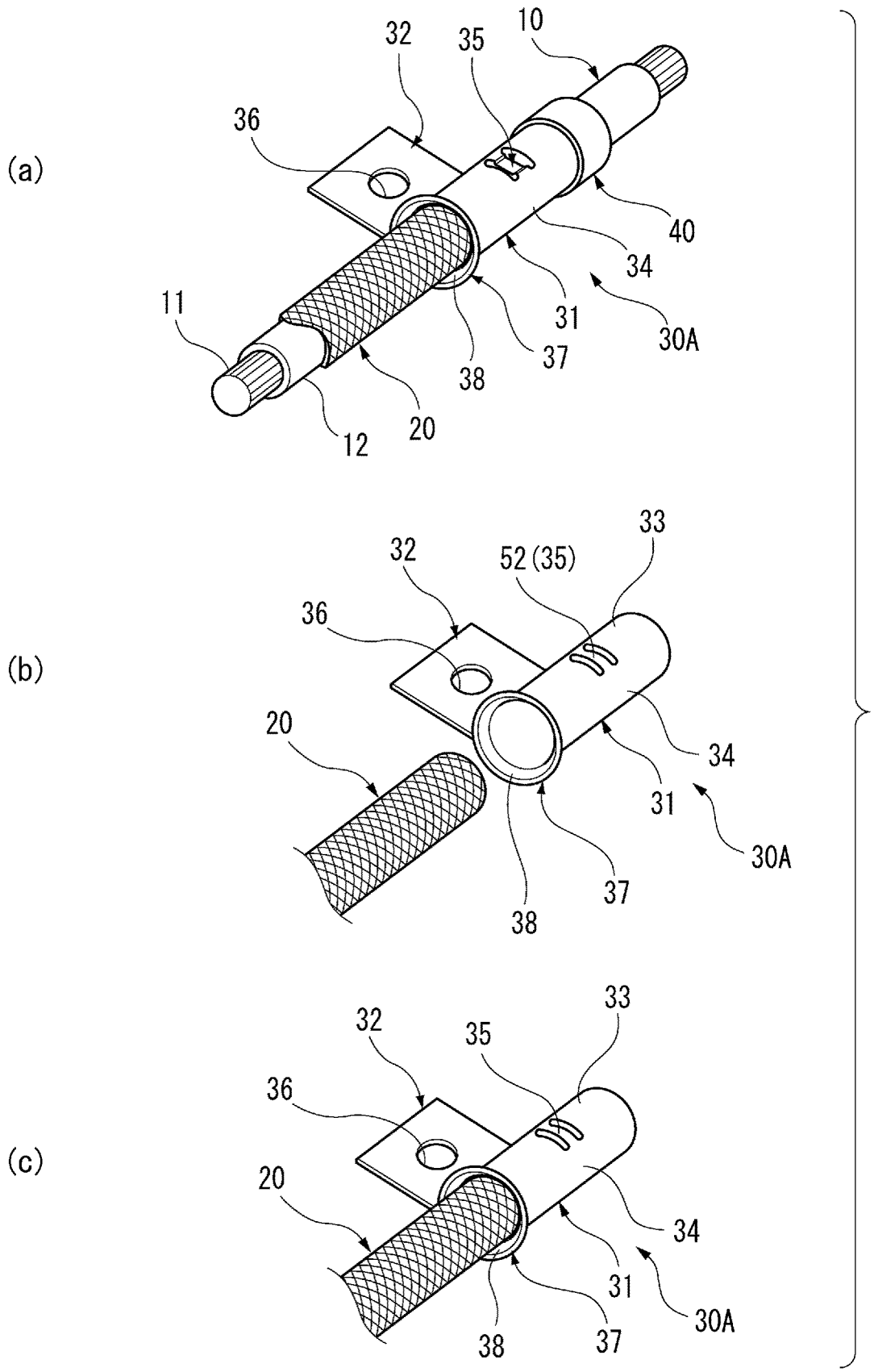
FIG. 9(a) is a perspective view of a shield terminal connected to a braided wire for describing a connection structure of the shield terminal according to another embodiment of the invention.
FIGS. 9(b) and 9(c) are perspective views of the shield terminal for describing an insertion work in which the sheathed wire mounted with the braided wire is inserted into the cylindrical portion.

FIG. 9(a) is a perspective view of the shield terminal connected to the braided wire for describing the connection structure of the shield terminal according to another embodiment of the invention. FIGS. 9(b) and 9(c) are perspective views for describing an insertion work to insert the sheathed wire mounted with the braided wire into the cylindrical portion.

As illustrated in FIG. 9(a), in this embodiment, a wire guiding portion 37 is formed in the cylindrical portion 34 of a shield terminal 30A. The wire guiding portion 37 is formed in the opening end on the opposite side to the caulked portion 33 in the cylindrical portion 34. The wire guiding portion 37 is formed in a tapered shape such that a tip end is widened outwardly in a radial direction, and the inner side serves as a guiding tapered surface 38.

In this embodiment, in order to fix the shield terminal 30, the sheathed wire 10 mounted with the braided wire 20 in its outer periphery approaches from the wire guiding portion 37 toward the cylindrical portion 34 as illustrated in FIG. 9(b), and the end of the braided wire 20 inserted from the opening end of the cylindrical portion 34 together with the sheathed wire 10 when being inserted into the cylindrical portion 34 as illustrated in FIG. 9(c) is guided by the wire guiding portion 37 which includes the guiding tapered surface 38.

Then, when the sheathed wire 10 covered by the braided wire 20 is inserted into the cylindrical portion 34 of the shield terminal 30, the insertion work is performed smoothly, and the workability is improved.

There is no concern that the braided wire 20 covering the sheathed wire 10 is damaged or disconnected by the opening end (edge) of the cylindrical portion 34 at the time of inserting.

Further, the invention is not limited to the above embodiments, and modifications and improvements can be appropriately made. Besides, materials, shapes, dimensions, numbers, and layout places of the respective components in the above embodiments are arbitrary and not limited as long as the invention can be achieved.

This application is based on Japanese Patent Application (No. 2016-056170) filed on Mar. 18, 2016, and the entire contents of which are incorporated herein by reference.

Herein, the features of the embodiments of the connector structure of the shield terminal according to the invention will be simply summarized in the following [1] to [3].

[1] A connection structure of a shield terminal (30) which is electrically connected and fixed to an opening end portion of a tubular braided wire (20) covering a sheathed wire (10) along a longitudinal direction thereof, wherein the shield terminal (30) includes:

a tubular caulked portion (33) in which a portion folded back to the outer side in the opening end portion of the braided wire (20) is caulked and fixed to an outer peripheral surface of the caulked portion (33) by a caulking sleeve (40), and a pressing urging portion (35) which is provided near the caulked portion (33), and presses and urges the braided wire (20) not to move the braided wire (20) with respect to the sheathed wire (10).

[2] The connection structure of the shield terminal according to [1], wherein the pressing urging portion (35) is provided in a cylindrical portion (34), which is integrally and coaxially formed with the caulked portion (33) and includes a terminal fixing portion (32) protruding from an outer peripheral surface of the cylindrical portion (34); and wherein the pressing urging portion (35) is configured to be plastically deformed such that a portion (the pressing portion 52), which is interposed between a pair of parallel notch grooves (51) notched by a predetermined length in a circumferential direction of the cylindrical portion (34), protrudes to an inner side of the cylindrical portion (34).

[3] The connection structure of the shield terminal according to [2], wherein a wire guiding portion (37) is provided in an opening end on the opposite side to the caulked portion (33) in the cylindrical portion (34) and a tip end of the wire guiding portion (37) is widened outwardly in a radial direction.

INDUSTRIAL APPLICABILITY

According to a connection structure of a shield terminal of the invention, an opening end portion of a braided wire is capable of being folded back to the outer side about an opening end serving as a base point of a caulked portion which is restricted in movement at a specified position with respect to a sheathed wire. Therefore, a folding work is easily performed. Even when the folded portion of the braided wire is caulked and fixed to an outer peripheral surface of the caulked portion by a caulking sleeve, the caulking work becomes easy.

REFERENCE SIGNS LIST

10: Sheathed wire
20: Braided wire
30: Shield terminal
32: Terminal fixing portion
33: Caulked portion
34: Cylindrical portion
35: Pressing urging portion
37: Wire guiding portion
40: Caulking sleeve
51: Notch groove

The invention claimed is:

1. A connection structure of a shield terminal which is electrically connected and fixed to an opening end portion of a tubular braided wire covering a sheathed wire along a longitudinal direction thereof, wherein the shield terminal includes:
   a tubular caulked portion in which a portion folded back to an outer side in the opening end portion of the braided wire is caulked and fixed to an outer peripheral surface of the caulked portion by a caulking sleeve; and
   a pressing urging portion which is provided near the caulked portion, and presses and urges the braided wire not to move the braided wire with respect to the sheathed wire,
   wherein the pressing urging portion is provided in a cylindrical portion, which is integrally and coaxially formed with the caulked portion and includes a terminal fixing portion protruding from an outer peripheral surface of the cylindrical portion, and
   wherein the pressing urging portion is configured to be plastically deformed such that a portion, which is interposed between a pair of parallel notch grooves notched by a predetermined length in a circumferential direction of the cylindrical portion, protrudes to an inner side of the cylindrical portion.

2. The connection structure of the shield terminal according to claim 1, wherein a wire guiding portion is provided in an opening end on the opposite side to the caulked portion in the cylindrical portion and a tip end of the wire guiding portion is widened outwardly in a radial direction.

3. The connection structure of the shield terminal according to claim 1, wherein the pressing urging portion is spaced from the caulked portion.

4. The connection structure of the shield terminal according to claim 1, wherein the pressing urging portion presses directly on the braided wire.

5. The connection structure of the shield terminal according to claim 1, wherein the pressing urging portion presses the braided wire independently of the caulking sleeve.

6. The connection structure of the shield terminal according to claim 1, wherein the braided wire is pressed and urged not to move with respect to the sheathed wire by the pressing urging portion before the opening end portion of the braided wire covering the sheathed wire is caulked and fixed to the caulked portion.

* * * * *